United States Patent [19]
Nakashima

[11] Patent Number: 5,643,368
[45] Date of Patent: Jul. 1, 1997

[54] PROCESS OF CLEANING A SUBSTRATE AND APPARATUS FOR CLEANING A SUBSTRATE

[75] Inventor: Kazushi Nakashima, Kasugai, Japan

[73] Assignees: Fujitsu Limited, Kanagawa; Fujitsu VLSI Limited, Aichi, both of Japan

[21] Appl. No.: 356,532

[22] Filed: Dec. 15, 1994

[30] Foreign Application Priority Data

Jan. 19, 1994 [JP] Japan ................. 6-004095

[51] Int. Cl.⁶ ................................................. B08B 3/12
[52] U.S. Cl. ................. 134/1.3; 134/26; 134/30
[58] Field of Search ....................... 134/1, 1.3, 26, 134/30

[56] References Cited

U.S. PATENT DOCUMENTS

| | | | |
|---|---|---|---|
| 3,066,050 | 11/1962 | Garton, Jr. | 134/30 |
| 3,076,730 | 2/1963 | Nolte | 134/30 |
| 4,997,490 | 3/1991 | Vetter et al. | 134/26 |
| 5,346,556 | 9/1994 | Perry et al. | 134/26 |
| 5,372,651 | 12/1994 | Kodama | 134/1 |

FOREIGN PATENT DOCUMENTS

5-129265  5/1993  Japan .

*Primary Examiner*—Scott Kastler
*Attorney, Agent, or Firm*—Nikaido, Marmelstein, Murray & Oram LLP

[57] ABSTRACT

A method for cleaning an object involves the steps of treating an object by dipping the object in a cleaning liquid, rinsing the object with a rinse liquid having a first lower temperature for removing dust particles from the object, and rinsing the object subsequently using a rinse liquid having a second, higher temperature, for removing the cleaning liquid, wherein the first temperature is set such that no icing occurs on the dust particles.

21 Claims, 11 Drawing Sheets

PROCESS OF CLEANING A SUBSTRATE AND APPARATUS FOR CLEANING A SUBSTRATE

BACKGROUND OF THE INVENTION

The present invention generally relates to fabrication of semiconductor devices and liquid crystal display devices, and more particularly to a process and apparatus cleaning used in a fabrication process of semiconductor devices or liquid display devices, for cleaning a substrate.

In the fabrication of semiconductor devices or liquid crystal display devices, a cleaning process for cleaning a semiconductor substrate or glass substrate is essential. Such a cleaning process generally includes a chemical treatment process in which the substrate is immersed in a liquid of chemicals for surface treatment and a rinse process, using a large amount of pure water, for removing the film of the chemical liquid from the surface of the substrate which is applied after removing the substrate from the cleaning liquid. It has been known conventionally that the rinse effect is enhanced substantially by using warm pure water. In such a rinse process, it is also important that deposition of dust particles on the cleaned Substrate surface is minimized.

In order to avoid deposition of dust particles in the rinse process, it is proposed, in the Japanese Laid-open Patent Publication 63-155729, to maintain the temperature of the pure water used in the rinse process at a low temperature such as 5° C. and introduce a low temperature gas such as liquid nitrogen into the pure water so as to cause a freezing of the dust particles. According to the foregoing conventional process, the dust particles act as nuclei of icing, and the dust particles thus surrounded by ice are removed from the substrate surface. However, such a process, while requiring an extensive facility, cannot achieve the desired rinse effect due to the low temperature of the pure water used for rinsing.

The inventor of the present invention has conducted a series of experiments about the rinse effect achieved by warm pure water, and found an interesting relationship between the temperature of the pure water used for rinse and the number of dust particles remaining on the substrate. Hereinafter, the referred to experiments and the result will be described in brief.

Figure 1:
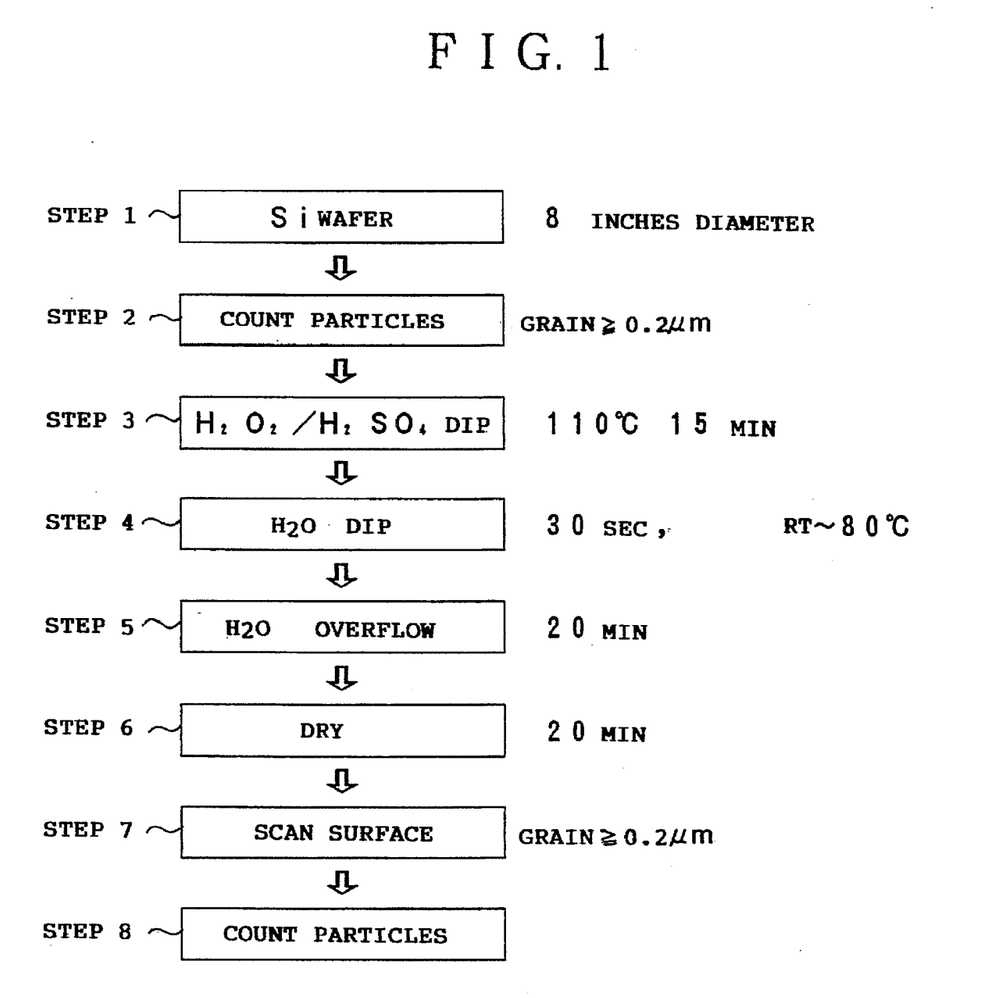
FIG. 1 is a diagram showing the experiment conducted for investigating the relationship between deposition of particles on a silicon substrate and rinse temperature.

FIG. 1 shows the procedure of the experiment.

Referring to FIG. 1, a silicon wafer of 8 inches diameter was prepared for the experiment in a step 1, and the number of the dust particles having a grain size larger than 0.2 μm was measured in a step 2. Next, in a step 3, the wafer was immersed in a cleaning liquid that was a mixture of 32% $H_2O_2$ and 98% $H_2SO_4$ in a volumetric ratio of 2:100. Next, the wafer was pulled up from the chemical liquid and subjected in a rinse process in step 4, wherein the rinse process was conducted for 30 minutes using pure water of various temperatures. After 30 minutes, the rinse was continued in a step 5 in a vessel while causing an overflow of the pure water. The substrate was subsequently dried in a step 6 for 20 minutes, and the surface of the wafer 8 was scanned in a step 7 for detection of particles having a grain size exceeding 0.2 μm. By analyzing the results of this measurement, in a step 8, the number of the remaining particles were obtained.

Figure 2:
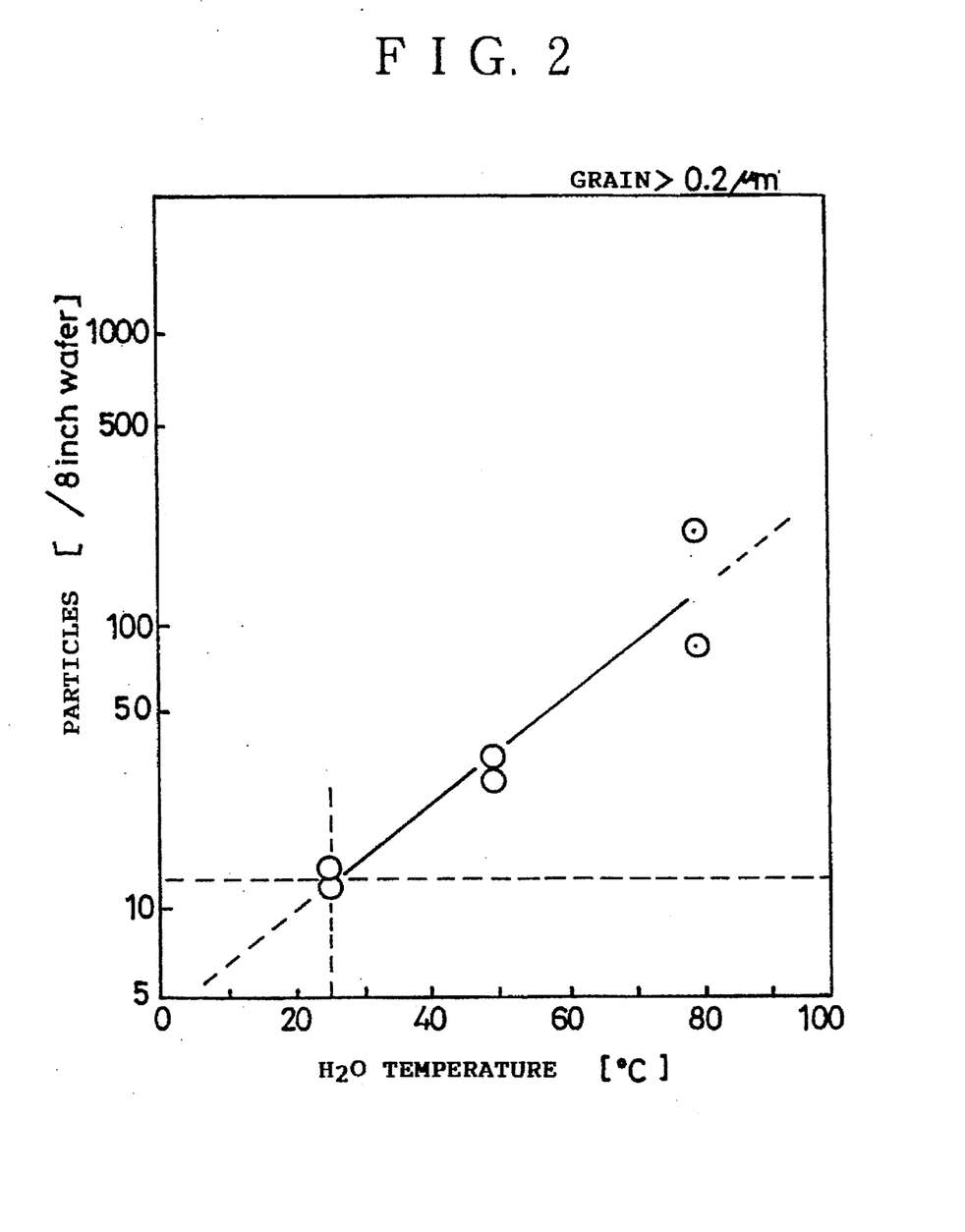
FIG. 2 is a diagram showing the result of the experiment of FIG. 1.

FIG. 2 shows the result of the experiment of FIG. 1.

Referring to FIG. 2, it will be noted that the number of the dust particles remaining on the substrate after the rinse process increases with increasing temperature of the pure water used for the rinse process. Although the reason of this tendency is not entirely understood, it is concluded that the number of the dust particles on the substrate exceeds the allowable limit of 15 particles when the temperature of the pure water is set higher than 25° C. in the rinse process. It should be noted that the foregoing 15 particles on the substrate is the allowable limit for an 8-inch substrate. Meanwhile, it is also known that the effect of rinse tends to become insufficient when the temperature of the pure water used for rinse is low.

Figure 3:
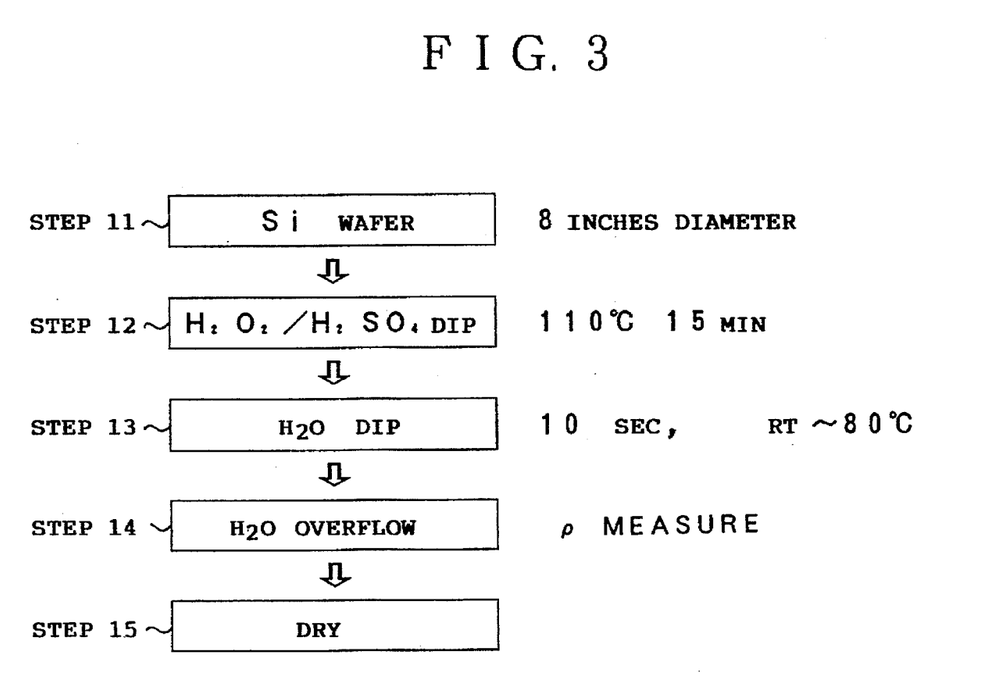
FIG. 3 is a diagram showing the experiment conducted for investigating the relationship between rinse temperature and specific resistance of a silicon substrate.

FIG. 3 shows the procedure of an experiment conducted by the inventor for evaluating the relationship between the temperature of the pure water rinse and the rinse effect.

Referring to FIG. 3, the experiment was started by preparing an 8-inch wafer of Si in a step 11, followed by a dipping process in a step 12 for dipping the 8-inch diameter substrate into the foregoing cleaning liquid, which is a mixture of $H_2O_2$ and $H_2SO_4$ similarly as before. Next, a rinse process was conducted in a step 13 in pure water for 10 seconds, while using various temperatures for the pure water, ranging from room temperature to 60° C. Further, the specific resistance of the wafer was measured in a step 14 while holding the wafer in a pure water overflow. Further, the wafer thus rinsed was dried in a step 15.

Figure 4:
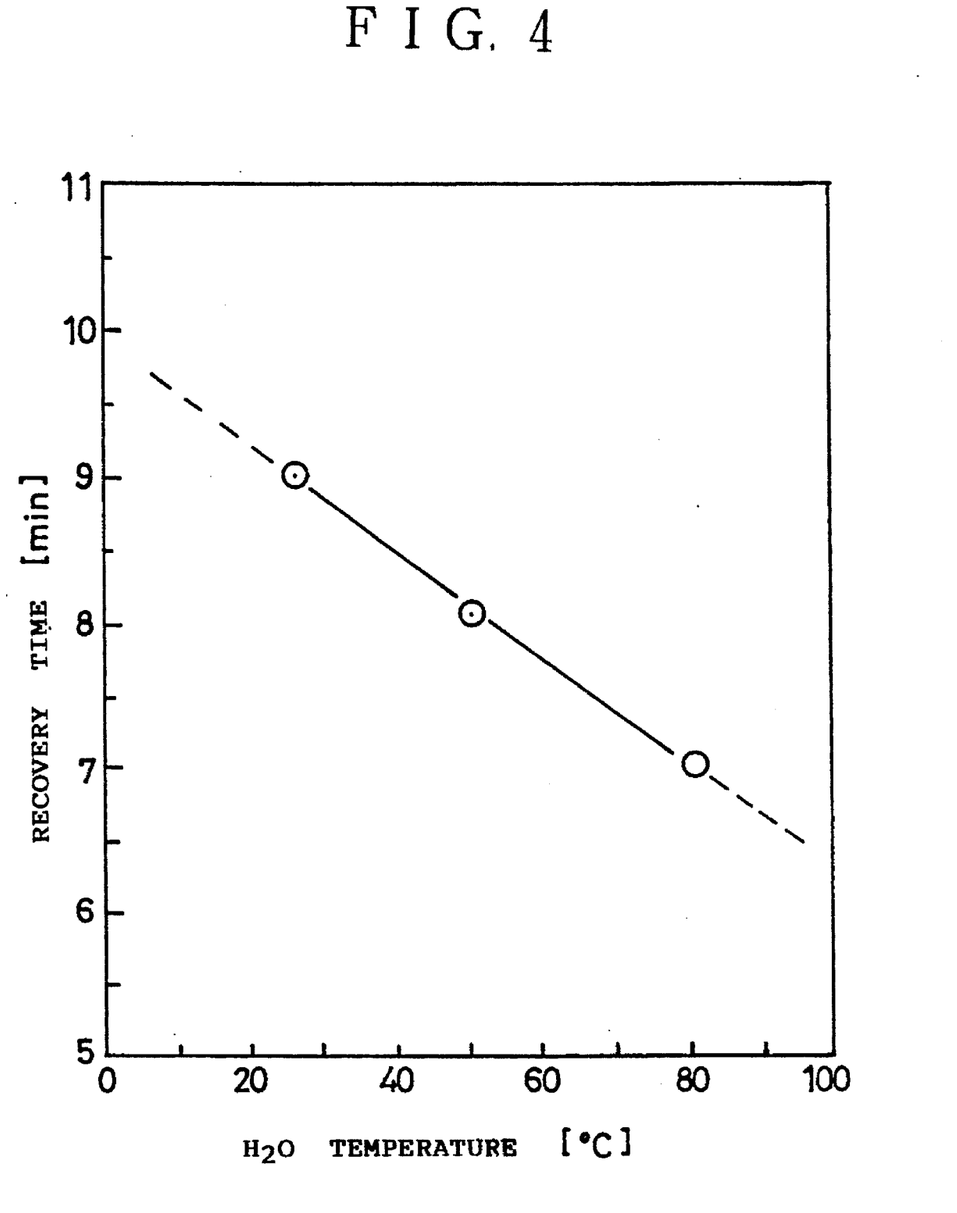
FIG. 4 is a diagram showing the result of the experiment of FIG. 3.

FIG. 4 shows the result the measurement of the specific resistance, wherein the vertical axis represents the time needed for recovering the specific resistance of the pure water and can be interpreted as representing the amount of the acid remaining on the surface of the substrate. As will be seen clearly from FIG. 4, the time needed for restoring the high specific resistance inherent to the pure water decreases with increasing temperature of the pure water used for the rinse. Thus, the tendency of FIG. 4 confirms the conventionally accepted knowledge that the rinse effect tends to become insufficient when a low temperature pure water is used for the rinse.

Summarizing above, it is concluded that the number of the dust particles remaining on the substrate increases when the temperature of the pure water is set high for better rinse effect, while use of low temperature pure water for minimizing the deposition of dust particles on the substrate invites an insufficient rinse effect. When the rinse effect is insufficient, chemicals used for the surface treatment of the substrate remain on the substrate surface, and the fabrication processes of the semiconductor device conducted subsequently are affected unwantedly.

SUMMARY OF THE INVENTION

Accordingly, it is a general object of the present invention to provide a novel and useful process for cleaning a semiconductor substrate as well as a process for fabricating semiconductor device that uses such a substrate cleaning process wherein the foregoing problems are eliminated.

Another and more specific object of the present invention is to provide a process for cleaning a semiconductor substrate that is capable of minimizing the number of dust particles remaining on the surface of the substrate after the cleaning process and simultaneously capable of minimizing the concentration of chemicals used in the cleaning process which remain upon the substrate surface after the cleaning process, as well as to provide a process for fabrication of a semiconductor device or a liquid crystal display device that includes such a cleaning process.

Another object of the present invention is to provide a method for cleaning an object, comprising the step of:

(a) treating an object by dipping said object in a cleaning liquid;

(b) rinsing said object, after said step (a), by a rinse liquid of a first temperature for removing dust particles from a surface of said object; and (c) rinsing said object, after said step (b) by a rinse liquid of a second, higher temperature, for removing said cleaning liquid from the surface of said object;

(d) wherein said first temperature is carried out at a temperature that does not cause formation of ice on the dust particles.

Another object of the present invention is to provide a cleaning apparatus for cleaning an object, comprising:

a first container for holding a cleaning liquid used for treating a surface of said object;

a second container for holding a rinse liquid used for rinsing said object treated by said cleaning liquid;

a first temperature regulator for supplying said rinse liquid to said second container at a first temperature;

a second temperature regulator for supplying said rinse liquid to said second container at a second temperature; and a controller for controlling said first and second regulators such that said rinse liquid is supplied to said second container first at said first temperature and is then subsequently supplied at said second temperature.

Another object of the present invention is to provide a cleaning apparatus for cleaning an object, comprising:

a first container for holding a cleaning liquid used for treating a surface of said object;

a second container for holding a rinse liquid supplied thereto at a first temperature;

a third container for holding a rinse liquid supplied thereto at a second, higher temperature;

a first temperature regulator for regulating the temperature of said rinse liquid in said second container at said first temperature; and a second temperature regulator for regulating the temperature of said rinse liquid in said third container at said second temperature.

According to the present invention, it is possible to minimize the retention of dust particles upon the object by conducting a rinse of the object at the first, low temperature. However, the first temperature should be set such that no freezing occurs on the dust particles. The substrate is then subjected to another rinse process for removing the cleaning chemicals thoroughly at a second, higher temperature. The temperature regulation can be achieved by means of ordinary heat exchangers in the present invention, and it is not necessary to provide additional facility that introduces liquid nitrogen to the rinse liquid. Thus, the process and apparatus of the present invention are suitable for mass producing semiconductor devices or liquid display devices.

Other objects and further features of the present invention will become apparent from the following detailed description when read in conjunction with the attached drawings.

DETAILED DESCRIPTION OF PREFERRED EMBODIMENTS

First, the principle of the present invention will be described.

FIG. 2 explained before shows the result of the experiments conducted by the inventor of the present invention as already noted.

Referring to FIG. 2 again, it will be noted that the number of the dust particles having a grain size larger than 0.2 μm disposed on an 8-inch diameter wafer is reduced below 15 if the temperature of the rinse process is set equal to or lower than 25° C., having a grain size larger than 0.2 μm.

Further, the inventor of the present invention has conducted a series of experiments to measure the concentration of metal impurities adsorbed on the surface of the substrate as a function of various temperatures of the pure water used for the rinse.

Figure 5:
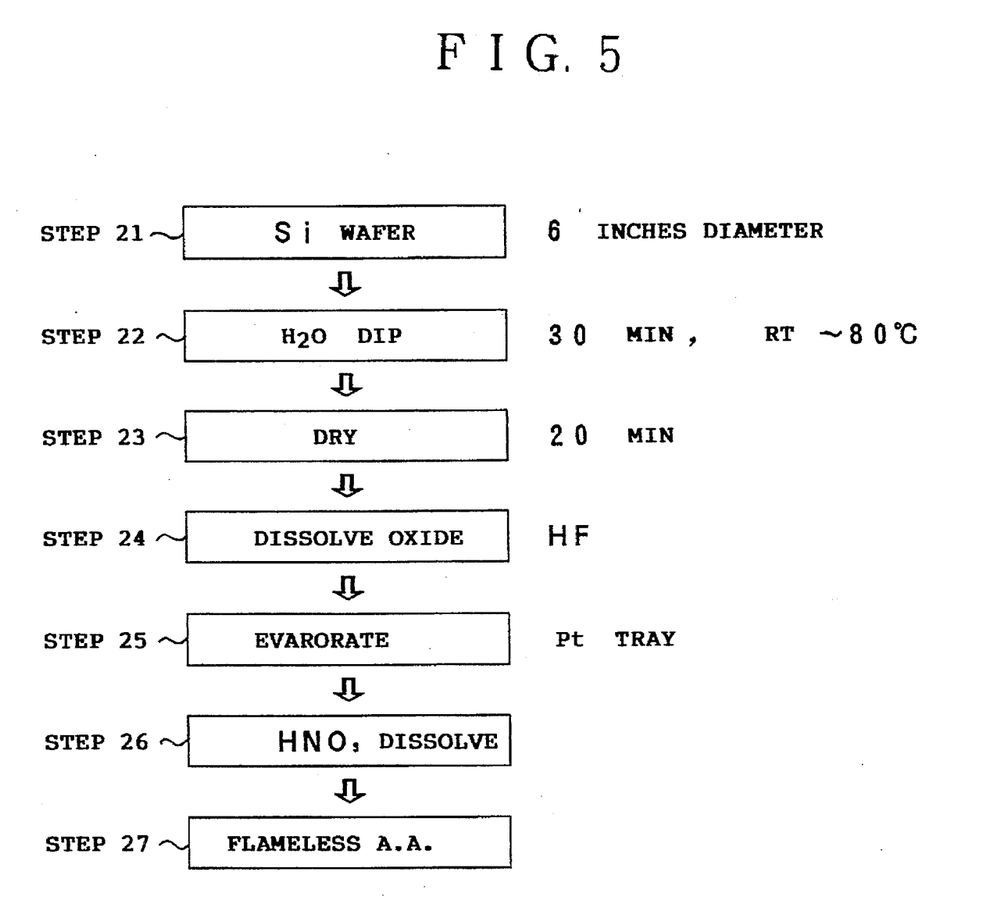
FIG. 5 is a diagram showing the experiment conducted for investigating the relationship between metal adsorption and rinse temperature.
Figure 6A:
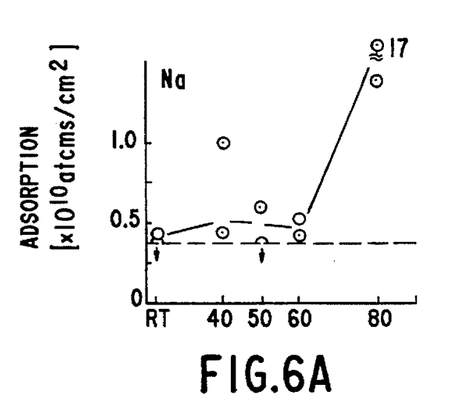
FIGS. 6A, 6B, 6C, 6D, 6E, 6F, 6G, 6H and 6I are diagrams showing the result of the experiment of FIG. 5.
Figure 6B:
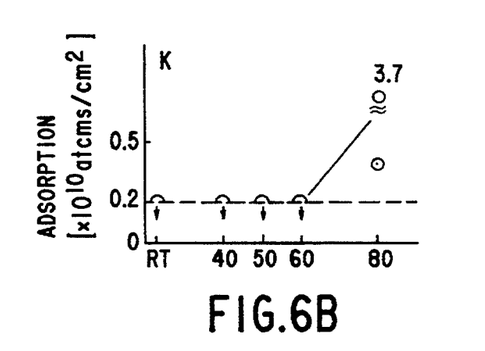
Figure 6C:
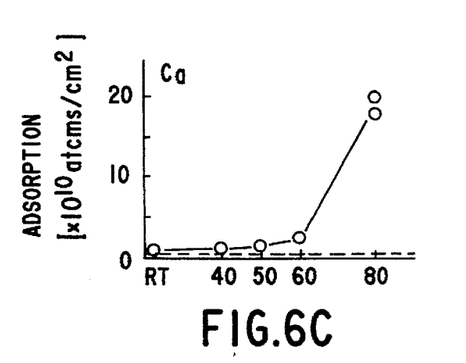
Figure 6D:
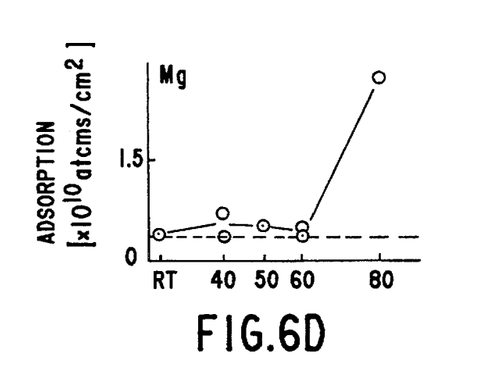
Figure 6E:
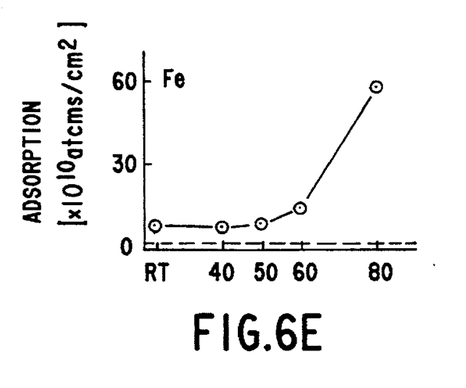
Figure 6F:
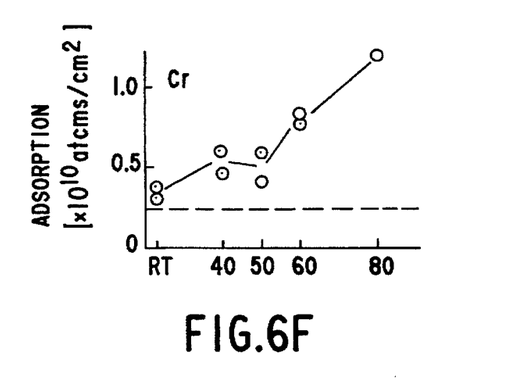
Figure 6G:
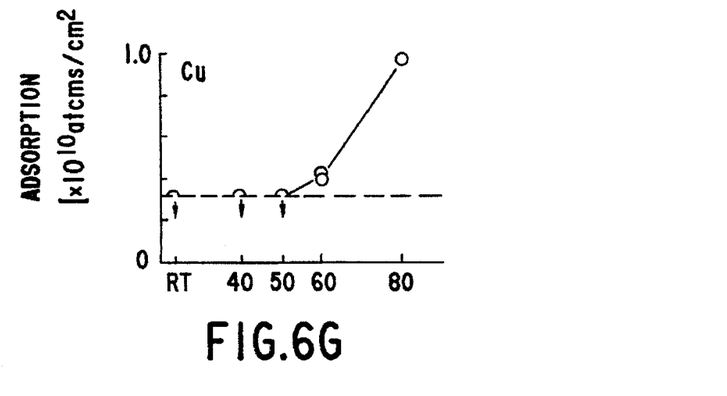
Figure 6H:
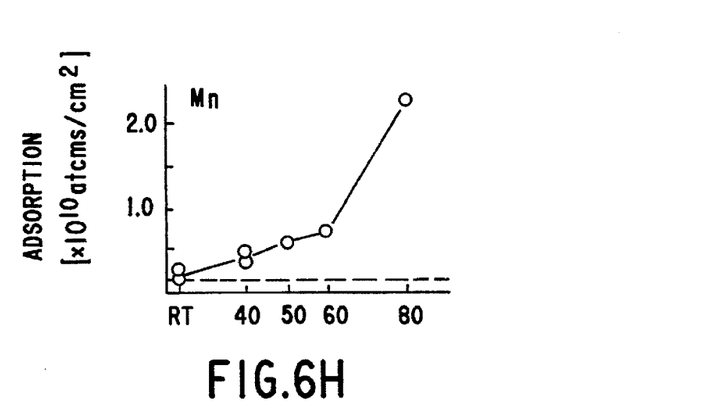
Figure 6I:
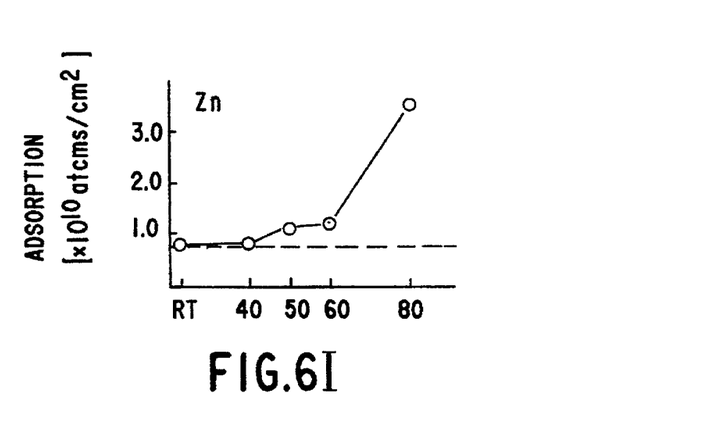

FIG. 5 shows the procedure of the experiment, while FIGS. 6A-6I show the result of the experiment.

In the present experiment, a 6-inch diameter wafer of Si was prepared in a step 21, wherein the Si wafer was dipped into pure water of various temperatures for 30 minutes in a step 22. After being pulled up from the pure water, the wafer was dried in a step 23 for 20 minutes. Subsequently, the wafer was immersed in a step 24 in an HF solution so as to remove the native oxide film from the surface of the substrate. Next, the native oxide film thus dissolved was dried on a platinum evaporation pan in a step 25, and the solid material thus obtained on the evaporation pan was dissolved in a $HNO_3$ solution in a step 26. Further, the $HNO_3$ solution thus obtained was subjected to a flameless atomic absorption analysis in a step 27 for quantitative analysis of metal elements.

It should be noted that the quantitative analysis was made for alkaline metals of Na and K, alkali earth metals of Ca and Mg, and transitional metal elements of Fe, Cr, Cu, Mn and Zn, as indicated in FIGS. 6A-6I, wherein FIG. 6A-6I clearly indicate that the amount of the adsorbed metals increases sharply when the temperature of the pure water used for the rinse process has exceeded 60° C. It should be noted that these metal elements exist commonly in the environment and tend to cause contamination of the substrate. From the relationship of FIGS. 6A-6I, it is concluded that the temperature of the pure water used for rinse should be held at 60° C. or less.

Figure 7:
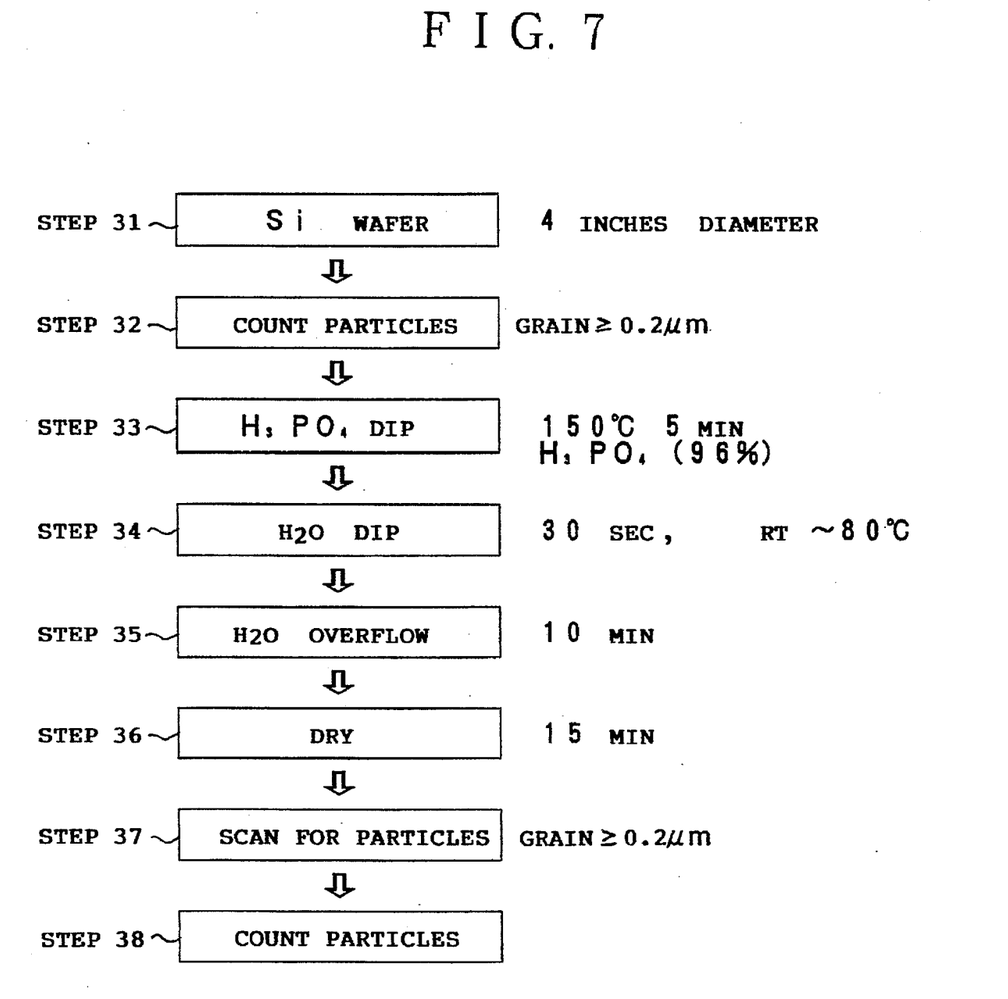
FIG. 7 is a diagram showing the experiment conducted for investigating the relationship between the retention of particles on a hydrophobic substrate and rinse temperature.

FIG. 7 shows an experiment conducted for studying the relationship between the nature of the substrate surface and the effect of rinse.

Referring to FIG. 7, a 4-inch diameter wafer of Si was prepared for the experiment in a step 31, and the number of the dust particles having a grain size larger than 0.2 μm, on the surface of the substrate thus prepared was measured in a step 32. Next, the substrate was dipped in a pyrophosphoric acid at 150° C. for 5 minutes in a step 33 for removing the silicon oxide film from the surface of the substrate. Next, the substrate having an exposed surface was dipped into pure water of various temperatures in a step 34. After the step 34, the substrate was rinsed in a pure water overflow in a step 35 for 10 minutes, followed by a drying process conducted in a step 36 for 15 minutes. Further, the surface of the substrate thus treated was subjected to a scanning process in a step 37 for detection of dust particles, and the number of the dust particles was evaluated in a step 38.

Figure 8:
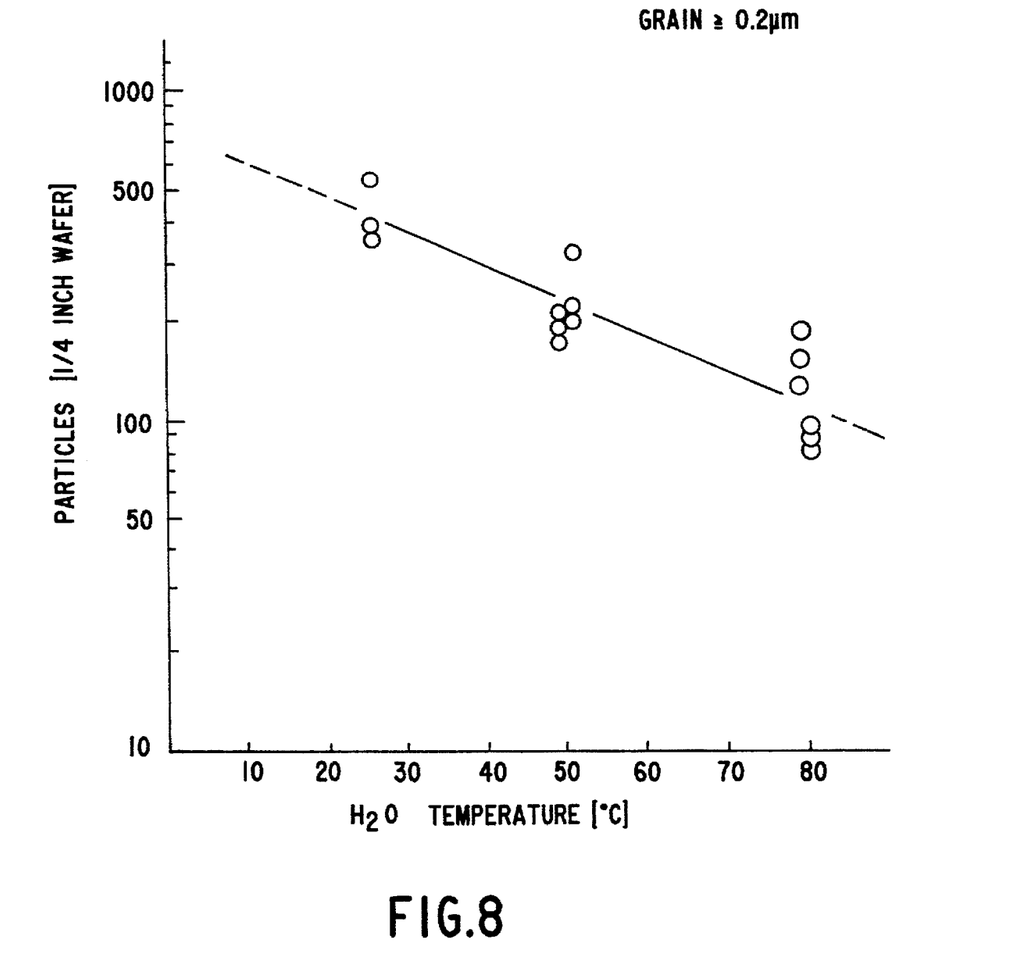
FIG. 8 is a diagram showing the result of the experiment of FIG. 7.

FIG. 8 shows the result of the experiment of FIG. 7. In the present experiment, it should be noted that the measurement of the dust particles was made for the substrate that has an exposed silicon surface, which is hydrophobic in nature.

Referring to FIG. 7, it will be noted that the number of the deposited dust particles decreases with increasing temperature of the pure rinse water, contrary to the previously explained tendency of FIG. 2. In other words, the relationship between the dust particles and the rinse temperature changes depending upon the nature of the surface of the wafer.

Hereinafter, a first embodiment of the present invention will be described with reference to FIG. 9.

Figure 9:
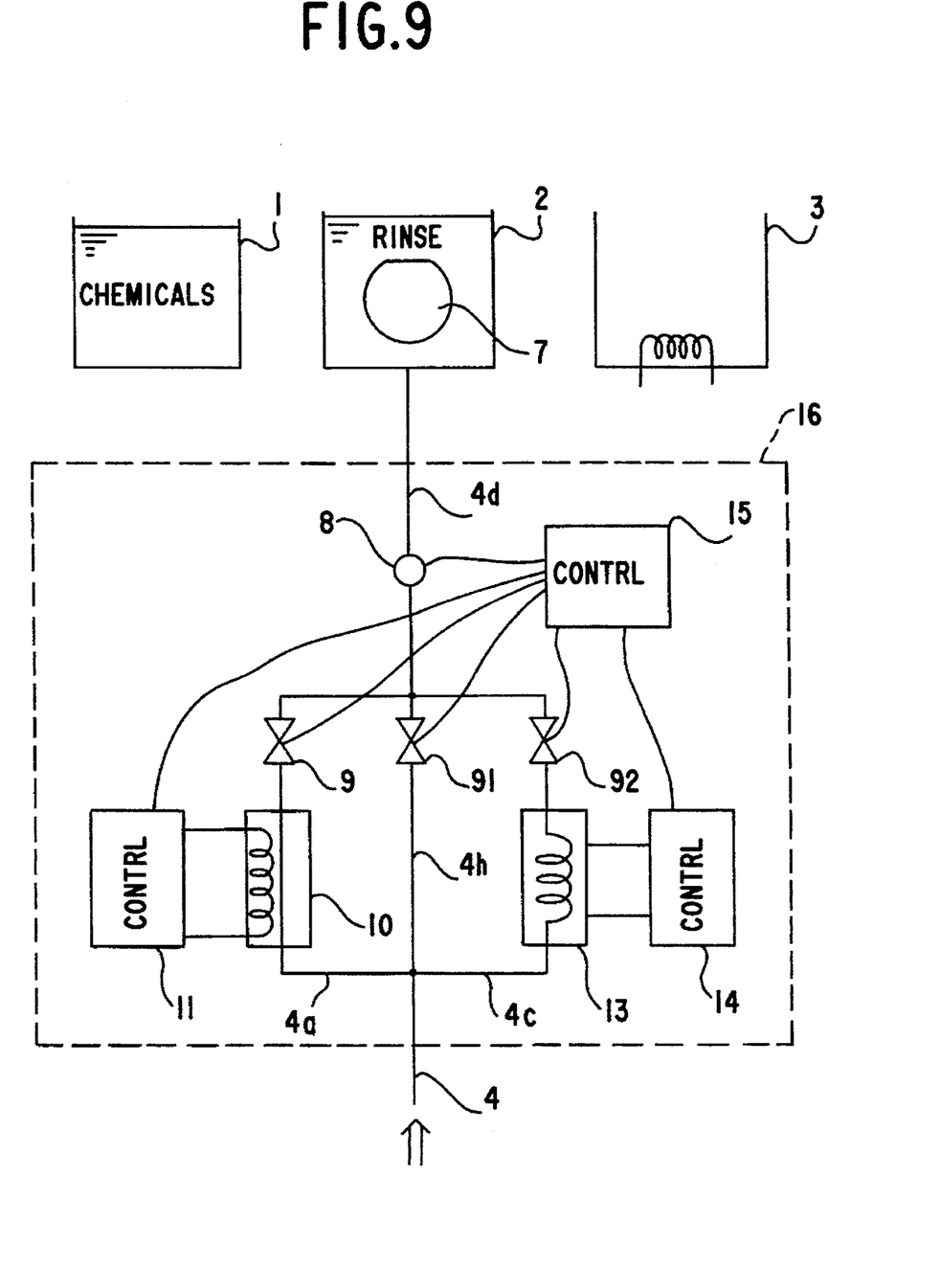
FIG. 9 is a diagram showing the construction of a cleaning apparatus according to a first embodiment of the present invention.

Referring to FIG. 9 showing a wafer cleaning apparatus according to the first embodiment of the present invention, the apparatus includes a tank 1 for holding a cleaning liquid such as the previously disclosed mixture of $H_2O_2$ and $H_2SO_4$ used for treating the surface of a wafer, and a tank 2 for holding pure water used for rinsing the wafer after treatment by the cleaning liquid in the tank 1. Further, there is provided a heating oven for drying the substrate after its rinse in the tank 2.

It should be noted that the tank 2 is supplied with pure water from a line 4, wherein the line 4 includes branches 4a–4c. The branch 4a includes a heat exchanger 10 therein, wherein the heat exchanger 10 is driven by a driver 11 and cools the pure water in the line 4a. The branch 4b, on the other hand, supplies the pure water supplied thereto directly to the tank 2 without substantial heating or cooling. Further, the branch 4c includes another heat exchanger 13 that is driven by a driver 14 and heats the pure water supplied to the tank 2 via the branch 4c. It should be noted that the branches 4a, 4b and 4c merge with each other via respective valves 9, 91 and 92 into a single line 4d, and the line 4d supplies the pure water to the tank 2. The pure water overflows in the tank 2 in which the substrate is dipped, and the rinse of the substrate is achieved as a result. Further, it will be noted that there is provided a temperature sensor 8 for detecting the temperature of the ultrapure water in the line 4d, wherein the temperature sensor 8 supplies an output indicative of the temperature of the pure water in the line 4d to a system controller 15 that controls the drivers 11 and 14 as well as the valves 9, 91 and 92.

Next the operation of the apparatus of FIG. 9 under control of the system controller 15 will be described in detail.

First, a silicon substrate 7 carrying a hydrophilic silicon oxide film on the surface as a native oxide film is dipped into the cleaning liquid in the tank 1 for surface treatment. In this process, the cleaning liquid is held at 110° C. similarly as before, and the treatment is continued for about 10 minutes. As a result of such a surface treatment, impurities and dust particles are separated from the surface of the wafer 7.

Next, the wafer 7 thus treated in the tank 1 is transferred to the tank 2 for rinsing in the pure water therein. Thereby, the system controller 15 first closes the valves 91 and 92 and cools the pure water in the line 4a by activating the driver 11 while monitoring the output of the temperature sensor 8, such that the temperature of the pure water is set to a first temperature lower than 25° C. At the first temperature, the rinse is conducted for 30 seconds at first, followed by another rinse process conducted also at the first temperature while causing the pure water to overflow from the tank 2. The overflow is continued approximately for 20 minutes. During the rinse process as such, one may introduce the pure water in the line 4b as necessary to adjust the temperature of the tank 2. As a result of low temperature rinse as such, the dust particles are effectively eliminated from the surface of the wafer 7. See the relationship of FIG. 2.

Next, the system controller 15 closes the valves 9 and 91 and warms the pure water in the branch 4c by activating the driver 14 to a second temperature while monitoring the output of the temperature sensor 8. Thereby, the temperature of the pure water is controlled not to exceed 60° C. Thus, the rinse of the wafer 7 is achieved and the cleaning liquid remaining on the surface of the wafer 7 is effectively removed. See the relationship of FIG. 4. By setting the temperature of the pure water in the tank 2 below 60° C., it is possible to minimize the adsorption of metal elements upon the surface of the wafer 7. See the relationship of FIGS. 6A–6I. In this process of rinse, one may introduce the pure water in the line 4b as necessary by opening the valve 91 to adjust the temperature of the tank 2.

Upon completion of the rinse at the foregoing second temperature, the wafer 7 is moved to the heating oven 3 for drying.

In the foregoing process, it should be noted that the surface of the silicon wafer 7 is covered by a hydrophilic oxide film and the relationship of FIG. 8 does not hold. Thus, by rinsing the wafer 7 by the pure water at the first temperature, the dust particles are effectively removed from the surface of the wafer 7. Further, by conducting the rinse process at the second temperature, it is possible to remove the cleaning liquid substantially completely. Further, it is possible to form an oxide film on the surface of the silicon wafer 7 intentionally, by dipping the wafer 7 into an oxidizing agent such as $HNO_3$, such that the surface of the silicon wafer 7 becomes hydrophilic.

Next, a second embodiment of the present invention will be described with reference to FIG. 10.

Figure 10:
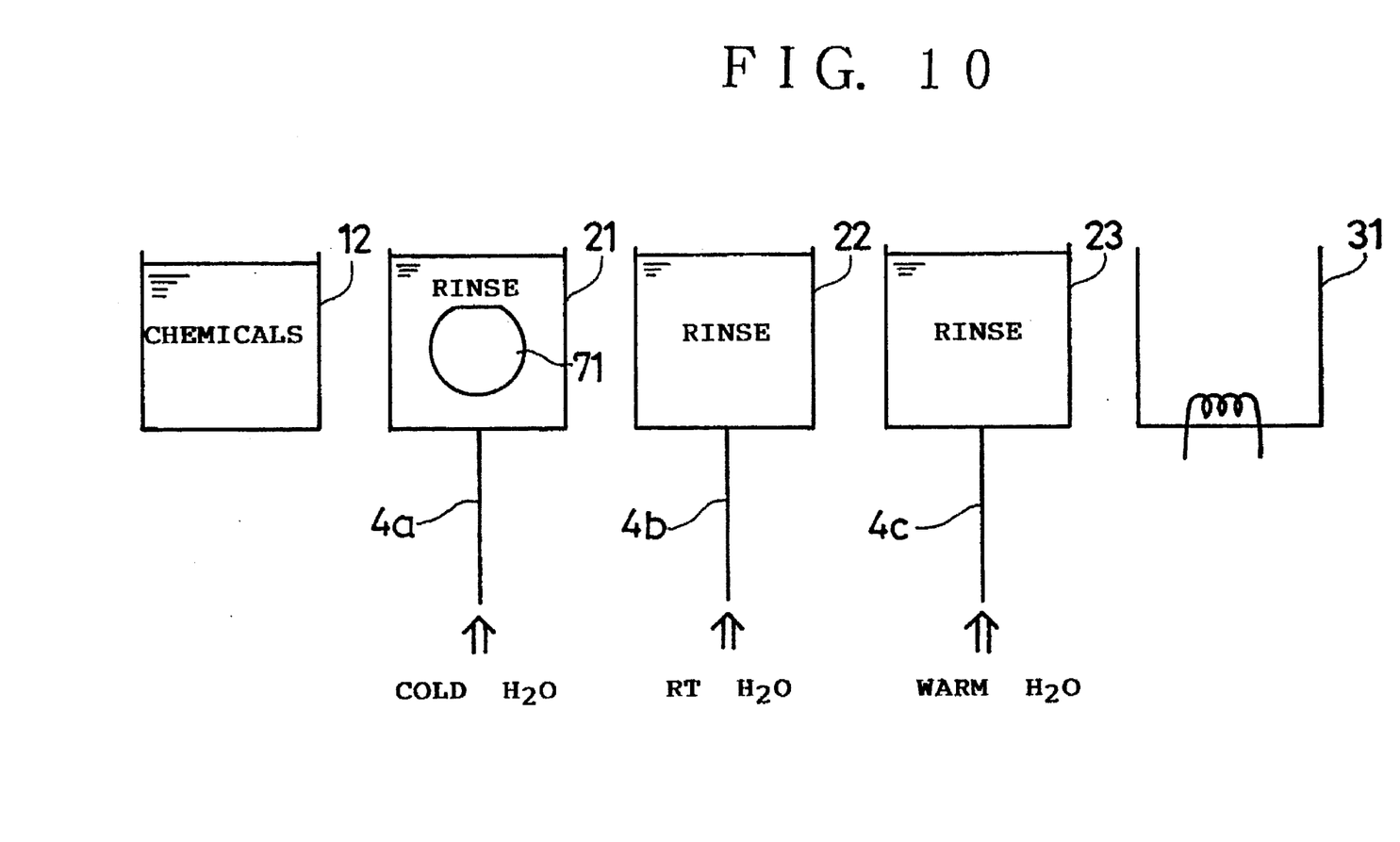
FIG. 10 is a diagram showing the construction of a cleaning apparatus according to a second embodiment of the present invention.

Referring to FIG. 10, the cleaning apparatus includes tanks 21–23 of pure water in addition to the tank 12 that contains the cleaning liquid, wherein the tank 21 is supplied with the pure water from the line 4a of FIG. 9 at the foregoing first temperature. On the other hand, the tank 22 is supplied with the pure water of ordinary temperature from the line 4b without temperature regulation. Further, the tank 23 is supplied with the pure water from the line 4c at the second temperature. Thus, a Si wafer 71 to be processed is first dipped into the cleaning liquid in the tank 12 for surface treatment, followed by a first rinse process conducted in the tank 21 at the first temperature. Thereby, the dust particles are effectively removed. After the rinse process in the tank 21, the wafer 71 is moved to the tank 22 for rinsing at the ordinary temperature. Further, the wafer 71 is moved to the tank 23 for rinsing at the second temperature wherein the cleaning liquid remaining on the surface of the wafer 71 is effectively removed.

It should be noted that the present invention is effective not only in the processing of semiconductor substrates but also the glass substrates of liquid crystal display devices.

Further, the present invention is not limited to the embodiments described heretofore, but various variations and modifications may be made without departing from the scope of the invention.

What is claimed is:

1. A method for cleaning a hydrophilic surface of a silicon substrate comprising the steps of:
   (a) contacting said hydrophilic surface with a cleaning liquid to form a first intermediate object having a cleaned surface, and having dust particles and cleaning liquid on its cleaned surface;
   (b) after said step (a), contacting said cleaned surface, having said dust particles and cleaning liquid thereon, with a rinse liquid consisting essentially of pure water at a first temperature higher than a temperature at which ice forms on the dust particles up to 25° C. for a time sufficient to remove dust particles from said hydrophilic surface and to thereby form an intermediate object comprising said hydrophilic surface having cleaning fluid thereon;
   (c) after said step (b), contacting said intermediate object comprising said hydrophilic surface having cleaning liquid thereon with a rinse liquid consisting essentially of pure water at a second temperature, which is higher than said first temperature, of up to 60° C., for a time sufficient to remove said cleaning liquid from said hydrophilic surface of said intermediate object; and
   (d) drying said dual rinsed hydrophilic surface of said silicon substrate immediately after said step (c) without conducting any further rinsing steps after said step (c).

2. A method as claimed in claim 1 wherein said first temperature is about 25° C. and said second temperature is about 60° C.

3. A method for fabricating a semiconductor device, comprising the steps of:
   (a) treating a semiconductor substrate having a hydrophilic surface by dipping said hydrophilic surface in a cleaning liquid for a time sufficient to form a cleaned hydrophilic surface, having cleaning liquid and dust particles thereon;
   (b) after said step (a), contacting said cleaned hydrophilic surface of said semiconductor substrate, having dust and cleaning liquid thereon, with a rinse liquid consisting essentially of pure water at a first, lower temperature at which ice does not form on the dust particles up to about 25° C. for a time sufficient to remove dust particles from said hydrophilic surface of said cleaned semiconductor substrate and to thereby form an intermediate semiconductor substrate comprising said hydrophilic surface having cleaning fluid thereon;
   (c) after said step (b), contacting said intermediate semiconductor substrate comprising a hydrophilic surface having cleaning liquid thereon with a rinse liquid consisting essentially of pure water at a second, temperature of up to about 60° C. which is higher than said first temperature, for a time sufficient to remove said cleaning liquid from said hydrophilic surface of said semiconductor substrate; and
   (d) drying said semiconductor substrate immediately after said step (c) without conducting any further rinse step after said step (c).

4. A method as claimed in claim 3 wherein said first temperature is about 25° C. and said second temperature is about 60° C.

5. A method for fabricating a liquid crystal display device, comprising the steps of:
   (a) treating a glass substrate by dipping said glass substrate in a cleaning liquid for a time sufficient to form a cleaned glass substrate having cleaning liquid and dust on a surface thereof;
   (b) after said step (a), contacting said cleaned glass substrate surface having dust and cleaning liquid thereon with a rinse liquid consisting essentially of pure water at a first, lower temperature at which ice does not form on the dust particles up to about 25° C. for a time sufficient to remove dust particles from said surface of said cleaned glass substrate and leave at least some of said cleaning liquid on said surface;
   (c) after said step (b), contacting said semiconductor substrate surface having cleaning liquid thereon with a rinse liquid consisting essentially of pure water at a second temperature up to about 60° C., which is higher than said first temperature, for a time sufficient to remove said cleaning liquid from the surface of said glass substrate; and
   (d) drying said glass substrate immediately after said step (c), without conducting any further rinse step after said step (c).

6. A method as claimed in claim 5 wherein said first temperature is about 25° C. and said second temperature is about 60° C.

7. A method as claimed in claim 1 wherein said step (b) is carried out by dipping said hydrophilic surface of said silicon substrate in a first container and said step (c) is carried out by dipping said hydrophilic surface of said intermediate silicon substrate in a container.

8. A method as claimed in claim 7, wherein said first container used in said step (b) and said container used in said step (c) are different, and wherein said method further includes an step of removing said intermediate silicon substrate from said first rinse liquid used in said step (b) and dipping said intermediate silicon substrate thus removed from said first rinse into said second rinse liquid used in said step (c).

9. A method as claimed in claim 7, wherein said first container used in said step (b) and said container used in said step (c) are the same, and said rinse liquid used in said step (b) and said rinse liquid used in said step (c) are the same; and wherein said method further includes an intermediate step between said steps (b) and (c) of raising the temperature of said rinse liquid from said first temperature to said second temperature.

10. A method as claimed in claim 3 wherein said step (b) is carried out in a first container and said step (c) is carried out in a different, second container.

11. A method as claimed in claim 10, wherein said container used in said step (b) and said container used in said step (c) are different, and wherein said method further includes an intermediate step of removing said hydrophilic surface of said semiconductor substrate from said first rinse liquid used in said step (b) and dipping said hydrophilic surface of said intermediate semiconductor substrate thus removed from said first rinse into said second rinse liquid used in said step (c).

12. A method as claimed in claim 10, wherein said container used in said step (b) and said container used in said step (c) are the same, said rinse liquid used in said step (b) and said rinse liquid used in said step (c) are the same, and wherein said method further includes an intermediate step between steps (b) and (c) of raising the temperature of said rinse liquid from said first temperature to said second temperature.

13. A method as claimed in claim 5 wherein said step (b) is carried out in a first container and said step (c) is carried out in a different, second container.

14. A method as claimed in claim 13, wherein said container used in said step (b) and said container used in said step (c) are different, and wherein said method further includes an intermediate step of removing said glass substrate from said first rinse liquid used in said step (b) and dipping said intermediate glass substrate thus removed from said first rinse into said second rinse liquid used in said step (c).

15. A method as claimed in claim 13, wherein said container used in said step (b) and said container used in said step (c) are the same, said rinse liquid used in said step (b) and said rinse liquid used in said step (c) are the same, and wherein said method further includes an intermediate step between said steps (b) and (c) of raising the temperature of said rinse liquid from said first temperature to said second temperature.

16. The process as claimed in claim 1 wherein said cleaning step is carried out by contacting said hydrophilic surface of said silicon substrate with an aqueous solution of acid and peroxide.

17. The process as claimed in claim 3 wherein said cleaning step is carried out by contacting said hydrophilic surface of said semiconductor substrate with an aqueous solution of acid and peroxide.

18. The process as claimed in claim 5 wherein said cleaning step is carried out by contacting said glass substrate with an aqueous solution of acid and peroxide.

19. The process as claimed in claim 1 wherein said cleaning step is carried out by contacting said hydrophilic surface of said silicon substrate with an aqueous solution of sulfuric acid and hydrogen peroxide.

20. The process as claimed in claim 3 wherein said cleaning step is carried out by contacting said hydrophilic surface of said semiconductor substrate with an aqueous solution of sulfuric acid and hydrogen peroxide.

21. The process as claimed in claim 5 wherein said cleaning step is carried out by contacting said glass substrate with an aqueous solution of sulfuric acid and hydrogen peroxide.

* * * * *